United States Patent
Naegele-Preissmann et al.

(10) Patent No.: US 9,170,164 B2
(45) Date of Patent: Oct. 27, 2015

(54) CAPACITIVE PRESSURE SENSOR AND A METHOD OF FABRICATING THE SAME

(71) Applicants: Dieter Naegele-Preissmann, Ingelheim am Rhein (DE); J. V. Sreedhar, Tamil Nadu (IN)

(72) Inventors: Dieter Naegele-Preissmann, Ingelheim am Rhein (DE); J. V. Sreedhar, Tamil Nadu (IN)

(\*) Notice: Subject to any disclaimer, the term of this patent is extended or adjusted under 35 U.S.C. 154(b) by 0 days.

(21) Appl. No.: 14/376,447
(22) PCT Filed: Dec. 17, 2012
(86) PCT No.: PCT/IN2012/000825
§ 371 (c)(1),
(2) Date: Aug. 4, 2014
(87) PCT Pub. No.: WO2013/118139
PCT Pub. Date: Aug. 15, 2013

(65) Prior Publication Data
US 2014/0374858 A1    Dec. 25, 2014

(30) Foreign Application Priority Data
Feb. 3, 2012 (IN) ............................. 411/CHE/2012

(51) Int. Cl.
| | |
|---|---|
| G01L 1/14 | (2006.01) |
| G01L 9/00 | (2006.01) |
| G01L 19/06 | (2006.01) |
| B81C 1/00 | (2006.01) |

(52) U.S. Cl.
CPC ............ *G01L 1/148* (2013.01); *B81C 1/00182* (2013.01); *B81C 1/00626* (2013.01); *G01L 9/0048* (2013.01); *G01L 9/0073* (2013.01); *G01L 19/0618* (2013.01); *B81B 2201/0264* (2013.01); *B81B 2203/0127* (2013.01)

(58) Field of Classification Search
CPC ................ B81B 2201/0264; B81B 2201/0292
USPC ...................................... 257/417, 415; 438/53
See application file for complete search history.

(56) References Cited

U.S. PATENT DOCUMENTS

| | | | |
|---|---|---|---|
| 5,343,064 A | 8/1994 | Spangler et al. | |
| 5,408,731 A | 4/1995 | Berggvist | |
| 6,109,113 A | 8/2000 | Chavan et al. | |
| 6,535,460 B2 | 3/2003 | Loeppert | |
| 8,921,956 B2 | 12/2014 | Dehe | |
| 8,942,394 B2 | 1/2015 | Conti | |
| 9,002,039 B2 | 4/2015 | Zhang | |
| 9,006,845 B2 | 4/2015 | Dehe | |
| 9,024,396 B2 | 5/2015 | Dehe | |
| 2004/0182165 A1 | 9/2004 | Miyashita | |
| 2004/0259286 A1* | 12/2004 | Dehe et al. ...................... | 438/50 |
| 2007/0052046 A1 | 3/2007 | Chu et al. | |
| 2012/0186354 A1* | 7/2012 | Okada ............................. | 73/724 |
| 2012/0319217 A1* | 12/2012 | Dehe et al. .................... | 257/415 |

\* cited by examiner

*Primary Examiner* — Yu-Hsi D Sun
*Assistant Examiner* — Wasiul Haider
(74) *Attorney, Agent, or Firm* — Mark M. Friedman

(57) ABSTRACT

The invention discloses a capacitive pressure sensor and a method of fabricating the same. The capacitive pressure sensor includes a fixed plate configured as a back plate, a movable plate configured as diaphragm for sensing pressure, wherein a cavity is formed between the fixed plate and the movable plate, an isolation layer between the fixed plate and the movable plate and electrical contacts thereof for minimizing the leakage current, plurality of damping holes for configuring the contour of the fixed plate as the deflected diaphragm when pressure is exerted, a vent hole extending to the cavity having resistive air path for providing equilibrium to the diaphragm and an extended back chamber for increasing the sensitivity of the capacitive pressure sensor. The capacitive pressure sensor is also configured for minimizing parasitic capacitance.

11 Claims, 21 Drawing Sheets

CAPACITIVE PRESSURE SENSOR AND A METHOD OF FABRICATING THE SAME

FIELD OF THE INVENTION

The present invention generally relates to pressure sensors. In particular, the present invention relates to fabrication of capacitive pressure sensor for acquisitic application.

BACKGROUND OF THE INVENTION

A sensor is a device that senses a specific media and converts the property of that media into a readable value through electrical signal. This type of sensors is also known as transducers. The present invention relates to a sensor for detecting various ranges of pressures, especially low pressures in the range of a few Pascal. Generally there are three different transduction mechanisms used to measure pressure such as piezoresistive, piezoelectric, and capacitive. However, the capacitive method has certain advantages over the other transduction mechanisms, particularly in low-pressure measurement. This is due to the percentage change in capacitance over pressure.

However, there are two major disadvantages in a capacitive pressure sensor such as parasitic capacitance and leakage current between the plates of the capacitor. Parasitic capacitance is the peripheral capacitance outside the main capacitance area. This is caused as a result of the parallel plates being attached at all parts of their respective surface. The leakage current between two plates deteriorates the capacitance and also degrade the resolution and operating frequency range of the sensor. Therefore, these two unwanted parameters are required to be either completely eliminated or substantially reduced in order to have very minimum impact in the sensor performance. Although ideally these two parameters should be zero, however, in reality, there is always some minimal value exist based on the design features and fabrication techniques.

Therefore in light of the above discussion, there is a need to provide an improved design features and fabrication techniques which can eliminate above mentioned disadvantages and produce a capacitive pressure sensor with minimum parasitic capacitance and leakage current.

SUMMARY OF THE INVENTION

The main object of the present invention is to provide a unique design features and fabrication sequences to produce an ultra capacitive pressure sensor which reduces parasitic capacitance and leakage current significantly.

Another object of the present invention is to provide unique design features and fabrication sequences to produce an ultra capacitive pressure sensor, which fulfills the design requirement in a simple manner.

Another object of the present invention is to provide unique design features and fabrication sequences to produce an ultra capacitive pressure sensor, which is cost effective.

In order to achieve the above mentioned objects the invention discloses a capacitive pressure sensor fabricated on a sensor die. The capacitive pressure sensor includes a fixed plate configured as a back plate anchored at the edge keeping the remaining area afloat for minimizing parasitic capacitance, a movable plate configured as diaphragm for sensing pressure, wherein a cavity is formed between the fixed plate and the movable plate to allow deflection of the diaphragm, an isolation layer between the fixed plate and the movable plate, and electrical contacts for minimizing the leakage current, plurality of damping holes disposed on the fixed plate for configuring the contour as the deflected diaphragm when pressure is exerted, a vent hole extending to the cavity having resistive air path for providing equilibrium to the diaphragm when exposed to the environmental pressure, and an extended back chamber with extended volume for increasing the sensitivity of the capacitive pressure sensor.

In one embodiment, the capacitive pressure sensor includes plurality of over pressure stopper stud disposed on the fixed plate for preventing the diaphragm from collapsing on the back plate in case of maximum over pressure on the diaphragm.

In another aspect of the invention, a method of fabricating a capacitive pressure sensor is disclosed. The method includes forming a first wafer substrate comprising a first layer and second layer bonded by a first adhesive layer and a masking layer of silicon dioxide on top of the second layer, etching away the masking layer and the second layer to form a cavity of concave shape, forming pattern on the masking layer for back plate, electrical isolation and vent channel by etching, forming back plate isolation for reduction of parasitic capacitance and damping hole through the second layer, forming a second wafer substrate comprising a third layer having a third adhesive layer and a fourth layer bonded by a fourth adhesive layer wherein the fourth layer is configured as constraint wafer, coupling the first substrate wafer with the second substrate wafer by bonding the masking layer as second adhesive layer, reducing the fourth layer to the range of tenth of microns by grinding to form a layer of diaphragm, forming an extended back chamber in the first layer for enhanced sensitivity and forming an opening for vent hole in the masking layer for providing equilibrium to the diaphragm.

In an embodiment, the method of fabricating a capacitive pressure sensor includes removing unnecessary adhesive layers for making the back plate and the diaphragm free.

In an embodiment, the method of fabricating a capacitive pressure sensor includes sputtering metal through holes on contact pads.

In an embodiment, the first wafer substrate is bonded with the second wafer substrate by fusion bonding.

In an embodiment, the formation of the extended back chamber in the first layer includes forming a first step of an extended back chamber, and forming a second step of full back chamber in the first layer.

In an embodiment, the method of fabricating a capacitive pressure sensor includes etching the mask layer around the edges except an anchoring area for forming an anchored back plate.

In an embodiment, the method of fabricating a capacitive pressure sensor includes forming over pressure stopper through the second layer to prevent short circuit between the back plate and the diaphragm in case of maximum pressure.

It is to be understood that both the foregoing general description and the following detailed description of the present embodiments of the invention are intended to provide an overview or framework for understanding the nature and character of the invention as it is claimed. The accompanying drawings are included to provide a further understanding of the invention and are incorporated into and constitute a part of this specification. The drawings illustrate various embodiments of the invention and together with the description serve to explain the principles and operation of the invention.

BRIEF DESCRIPTION OF THE DRAWINGS

The above-mentioned and other features and other advantages of the invention will be better understood and will become more apparent by referring to the exemplary embodiments of the invention, as illustrated in the accompanying drawings, wherein.

DETAIL DESCRIPTION OF THE INVENTION

Reference will now be made to the exemplary embodiments of the invention, as illustrated in the accompanying drawings. Where ever possible same numerals will be used to refer to the same or like parts.

Figure 1:
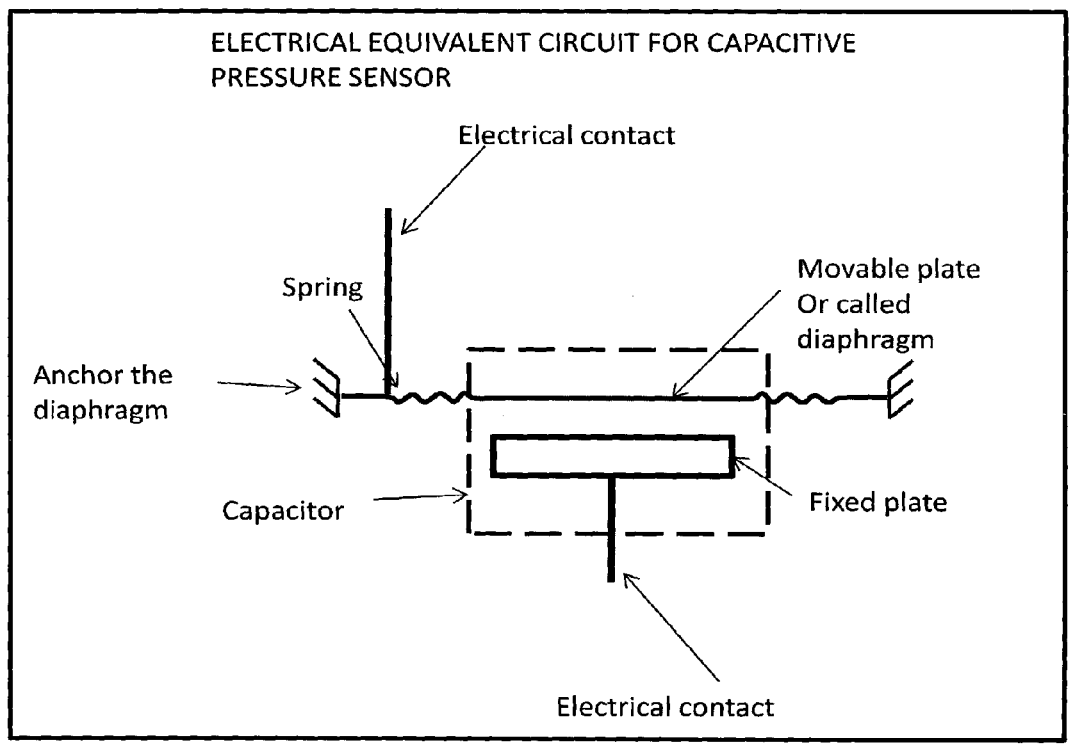
FIG. 1 illustrates a typical capacitive sensor model.

Disclosed herein is a capacitive pressure sensor with less parasitic capacitance and leakage current and method of fabrication of such ultra capacitive pressure sensor. FIG. 1 illustrates an electrical model of such a capacitive pressure sensor. Typically performance of such a pressure sensor is dependent on few key features. For example, these features include higher capacitance and change in capacitance, over-pressure protection, minimum parasitic capacitance, minimum leakage current, equalizing the cavity to atmospheric pressure while safe guarding low frequency sensitivity, extended back volume, volume manufacturability and cost. Described below are the unique invented features of the present invention that gives this pressure sensor best performance and makes it the most commercially viable product.

Figure 2A:
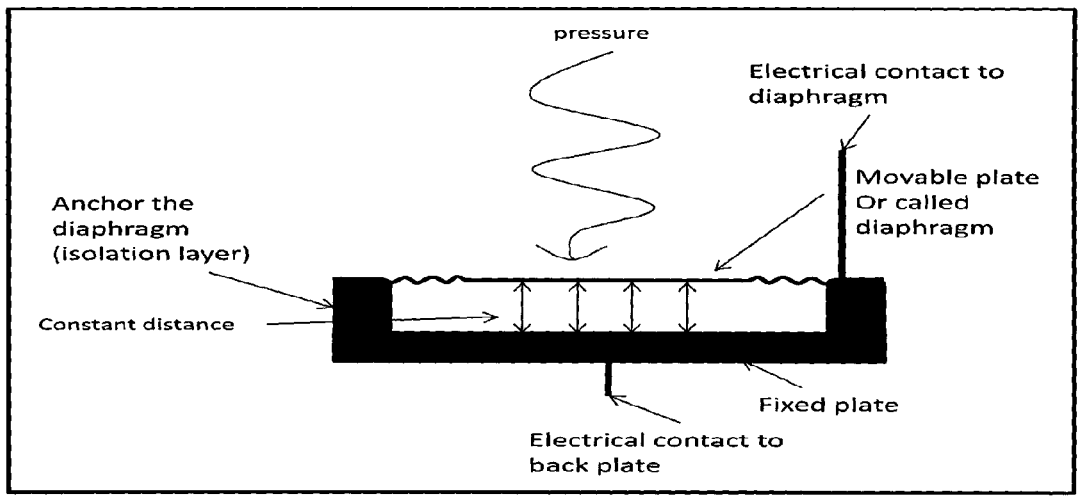
FIG. 2a illustrates plate design technique in a conventional capacitive sensor.

(1) Higher Capacitance and Change in Capacitance:

The capacitor's two plates may be fabricated using single crystal silicon as a base material. The standard semiconductor (CMOS) technology with micromachining may be used for fabricating the sensor. In order to create a capacitive sensor to sense the pressure applied to diaphragm, a cavity or space is formed between the capacitor plates. Therefore, diaphragm can bend when the pressure is exerted on it and thereby any change in capacitance reflects the amount of pressure exerted. In a conventional design, the two plates of the capacitive sensor are manufactured according to FIG. 2a.

Figure 2B:
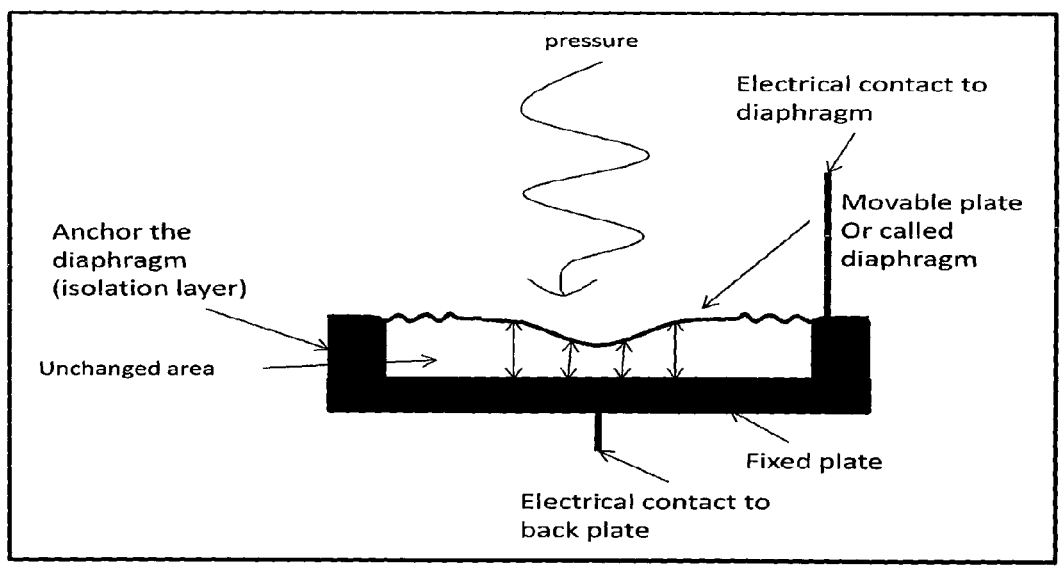
FIG. 2b illustrates deformation of the plate in arc form when pressure is sensed by the conventional capacitive sensor which shows certain portions of the capacitance area remain unchanged in deformed stage.

When the pressure waves are exerted on the diaphragm, the diaphragm oscillates back and forth and thereby the capacitance value changes in the capacitive pressure sensor. The deflection of the diaphragm is proportional to the amount of pressure force sensed on the diaphragm. However, there is one disadvantage with the conventional design. In order to get maximum sensitivity, the diaphragm should deflect to its maximum level without collapsing on the opposite plate (back plate). When the diaphragm deflects, it bends in an arc shape as shown in FIG. 2b. At this point in time, certain areas underneath the diaphragm do not enlarge significantly. Therefore, the distance between the plates remain almost unchanged and do not contribute to the change in capacitance.

Figure 3A:
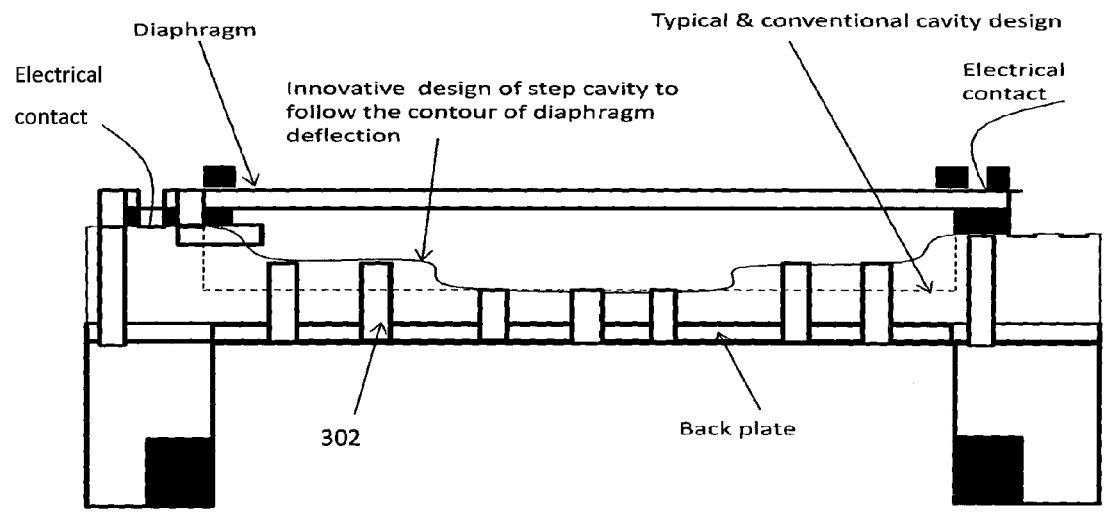
FIG. 3a illustrates unique cavity design of a capacitive sensor according to one embodiment of the present invention.

This present design as shown in FIG. 3 forms the distance between the capacitance plates to follow the contour of the deflected diaphragm when the pressure is applied on the diaphragm. This is achieved by the use of damping holes 302 as shown in FIG. 3a. This produces maximum change in capacitance.

Figure 3B:
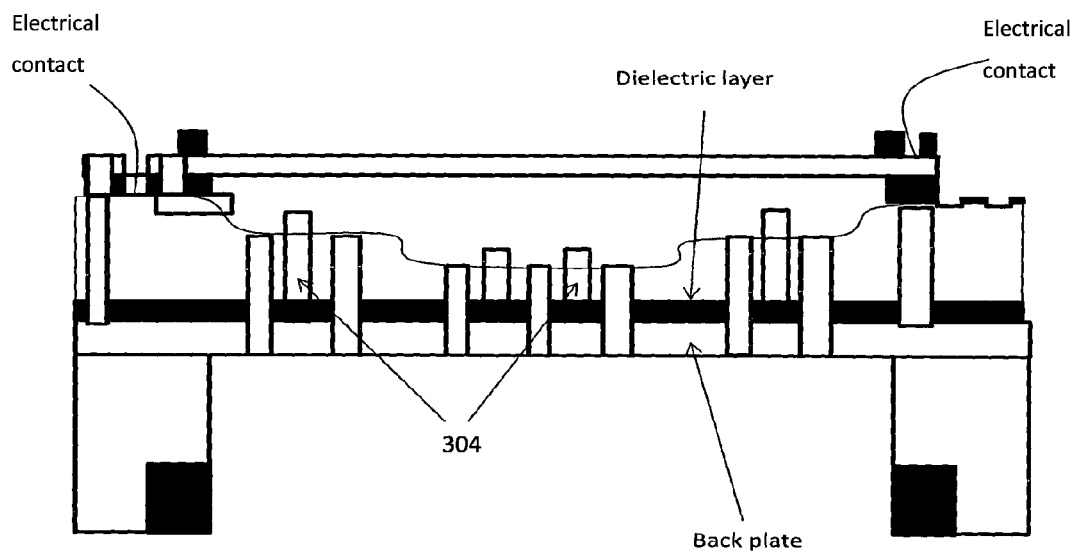
FIG. 3b illustrates over pressure stopper stud according to one embodiment of the present invention.

(2) Over Pressure Protection:

In the present invention, fabrication technique over-pressure stopper 304 is used to form inside the cavity. In the event the diaphragm experiences maximum over-pressure, the over-pressure stopper studs 304 will prevent the diaphragm from being collapsed on to the back plate and make a short circuit in the device. The over-pressure stopper studs are formed on a dielectric layer, and therefore are not connected to an electrical bias as shown in FIG. 3b.

Figure 4:
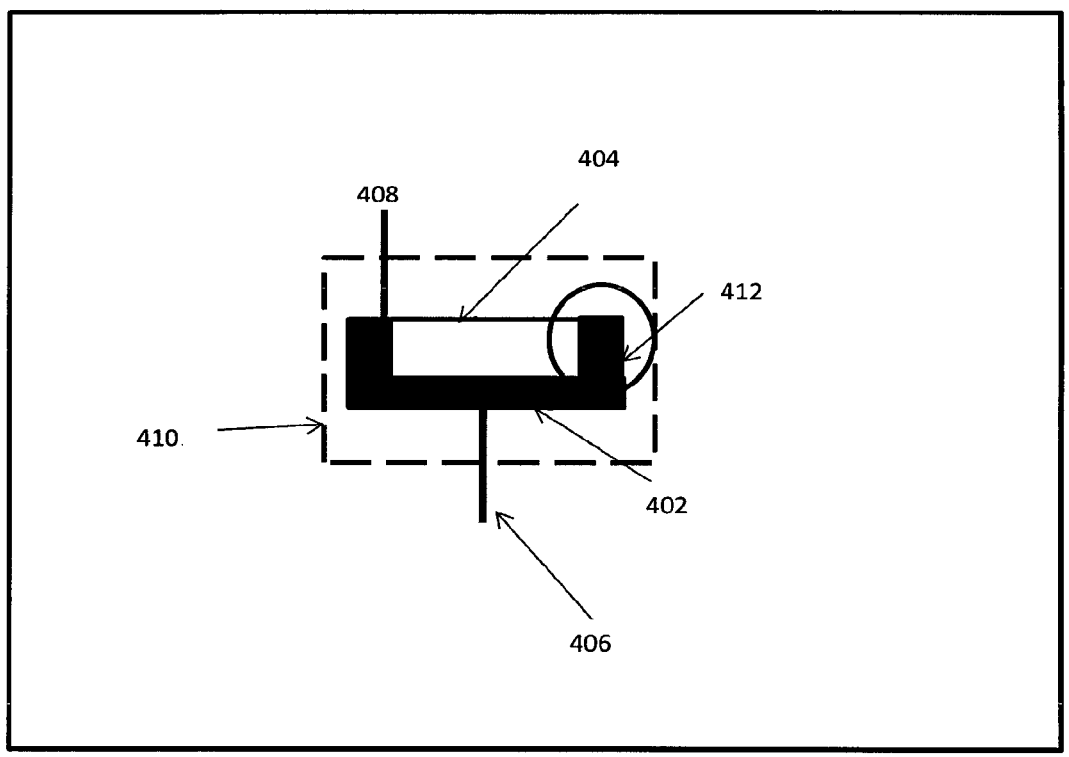
FIG. 4 illustrates formation of parasitic capacitance in the capacitive sensor according to the one embodiment of the present invention.

(3) Reduced Parasitic Capacitance:

As discussed above, the capacitive pressure sensor includes two parallel plates. One plate is fixed (402) and the other plate is a movable one called the diaphragm (404). The capacitor includes electrical contacts (406, 408) connected respectively with the fixed plate 402 and diaphragm 404. When these two plates are fabricated to form a capacitor, there are two types of capacitance formed such as active capacitance 410 and passive capacitance 412. The passive capacitance is also referred as parasitic capacitance. This is illustrated in FIG. 4 where both plates are held together. This passive capacitance is formed in parallel to active capacitance and thereby reduces overall performance of the sensor device. Therefore the primary object of the present invention is to either avoid or minimize the parasitic capacitance. This unique invention of design and method of fabrication enable such design and fabrication to minimize the parasitic capacitance to less than 20% of total capacitance.

Figure 5:
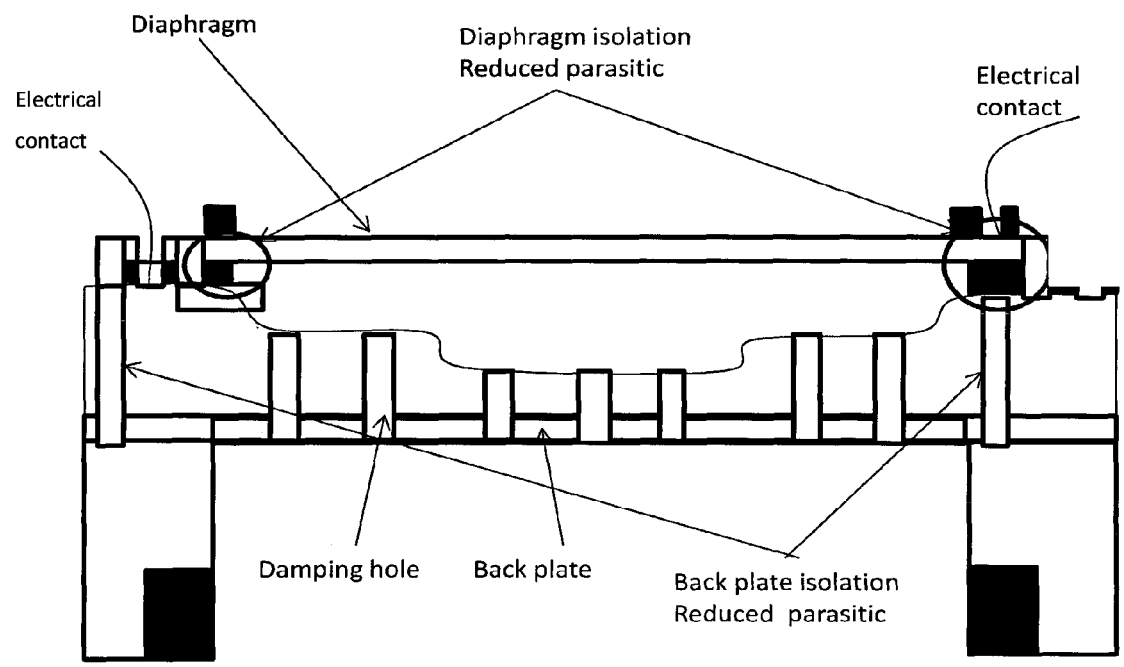
FIG. 5 illustrates isolation of both plates to reduce parasitic capacitance according to one embodiment of the present invention.
Figure 6:
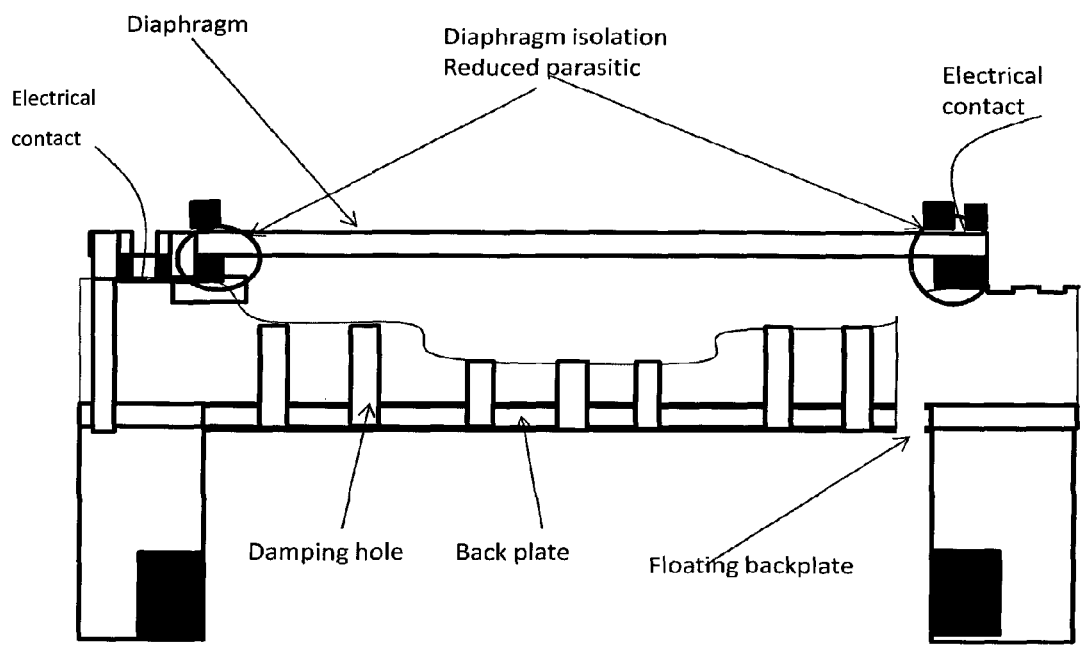
FIG. 6 illustrates floating back plate to reduce parasitic and structural stress in the capacitive sensor according to one embodiment of the present invention.

The present method reduces parasitic capacitance by isolating the fixed plate and diaphragm's superimposed area as shown in FIG. 5. In this design, there is an option to make the back plate free. Therefore the back plate is anchored with a small beam while the rest of the area stays afloat. This allows forming absolute minimum parasitic capacitance and reduces structural stress as shown in FIG. 6.

Figure 7:
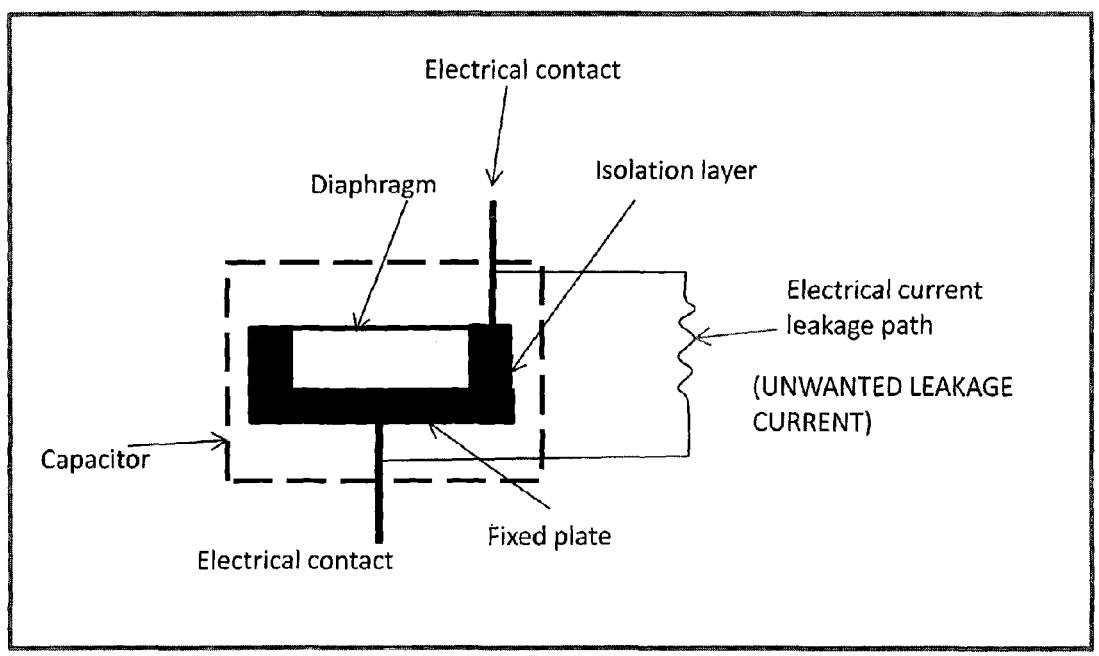
FIG. 7 illustrates leakage path between both paths in the capacitive sensor.

(4) Leakage Current between Both Plates:

When the two plates are fabricated to form a capacitor, there are also areas formed which holds both plates together. These are called isolation areas. However, tiny electrical currents tend to leak through between both plates while the device is powered up as shown in FIG. 7. Depending on the amount of leakage current, it can deteriorate the device performance. Therefore, a careful consideration is required during the design to either avoid or minimize the leakage current.

Figure 8:
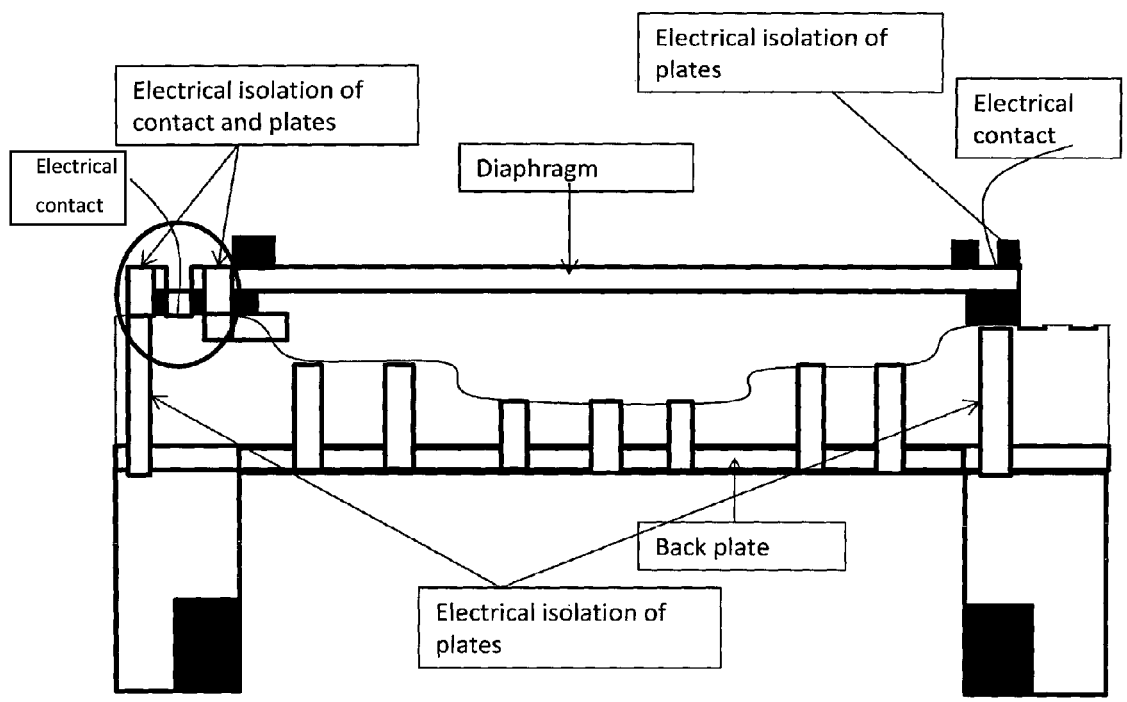
FIG. 8 illustrates electrical isolation to avoid leakage current by shorting between plates according to one embodiment of the present invention.

This present design and method of fabrication enables to minimize the leakage current as illustrated in FIG. 8. The area around electrical contacts is uniquely isolated to ensure no shorting between both plates. In addition, the back plate and diaphragms are uniquely isolated all around to ensure no shorting between both plates.

Figure 9:
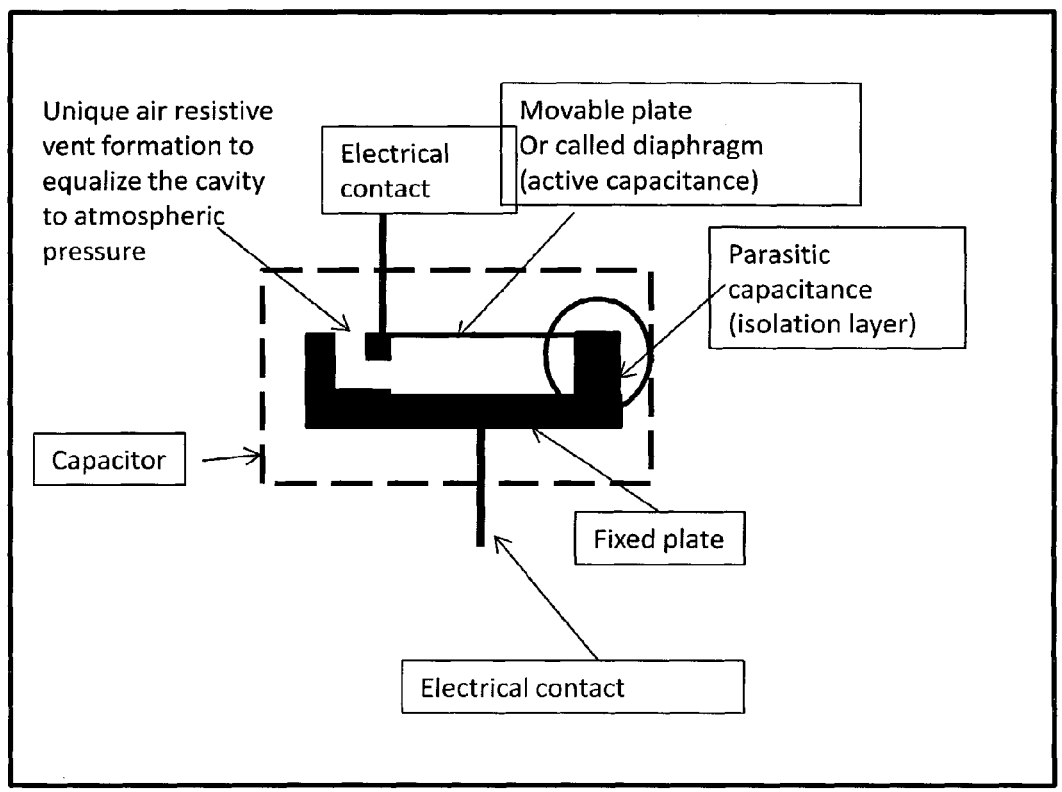
FIG. 9 illustrates air resistive vent towards cavity in the capacitive sensor according to one embodiment of the present invention.

(5) Unique Vent Formation to Vent the Cavity to Atmospheric Pressure:

Some of the pressure sensors are used in gauge application where the diaphragm is exposed to the same environmental pressure on both sides as shown in FIG. 9. In order to achieve this equilibrium with the diaphragm, a vent has to be formed to expose the cavity. However, this vent has to be designed and fabricated in such a way that incident pressure is not exposed to the back side of the diaphragm at the same time, especially for sound pressure.

Figure 10:
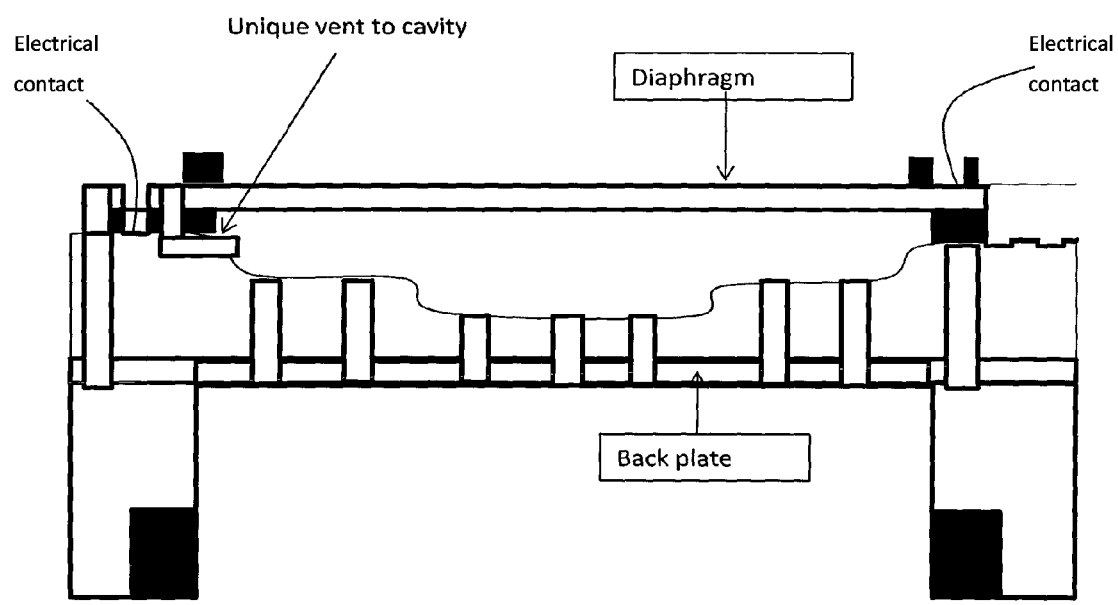
FIG. 10 illustrates a vent channel formed in a capacitive sensor according to one embodiment of the present invention.

The present design and method of fabrication enables such design and fabrication to form a vent that exposes the cavity to atmosphere pressure while creating a resistive path that creates a phase shift to sound waves entering the cavity as illustrated in FIG. 10.

Figure 11:
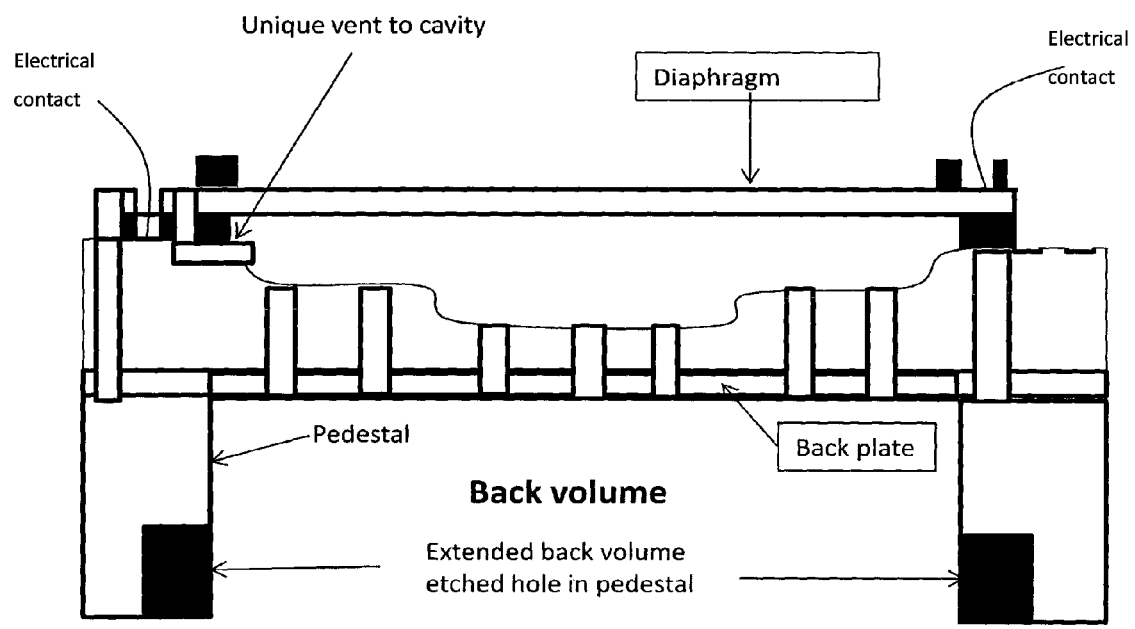
FIG. 11 illustrates formation of extended back volume in a capacitive sensor according to one embodiment of the present invention.

(6) Extended Back Volume:

The back volume is an integral part of the sensor. The higher is the back volume, the better is the sensitivity performance of the sensor. In order to increase back volume of the sensor, part of the pedestal is etched away. The present design and fabrication sequence enables the formation of the extended back volume as shown in FIG. 11.

Figure 12:
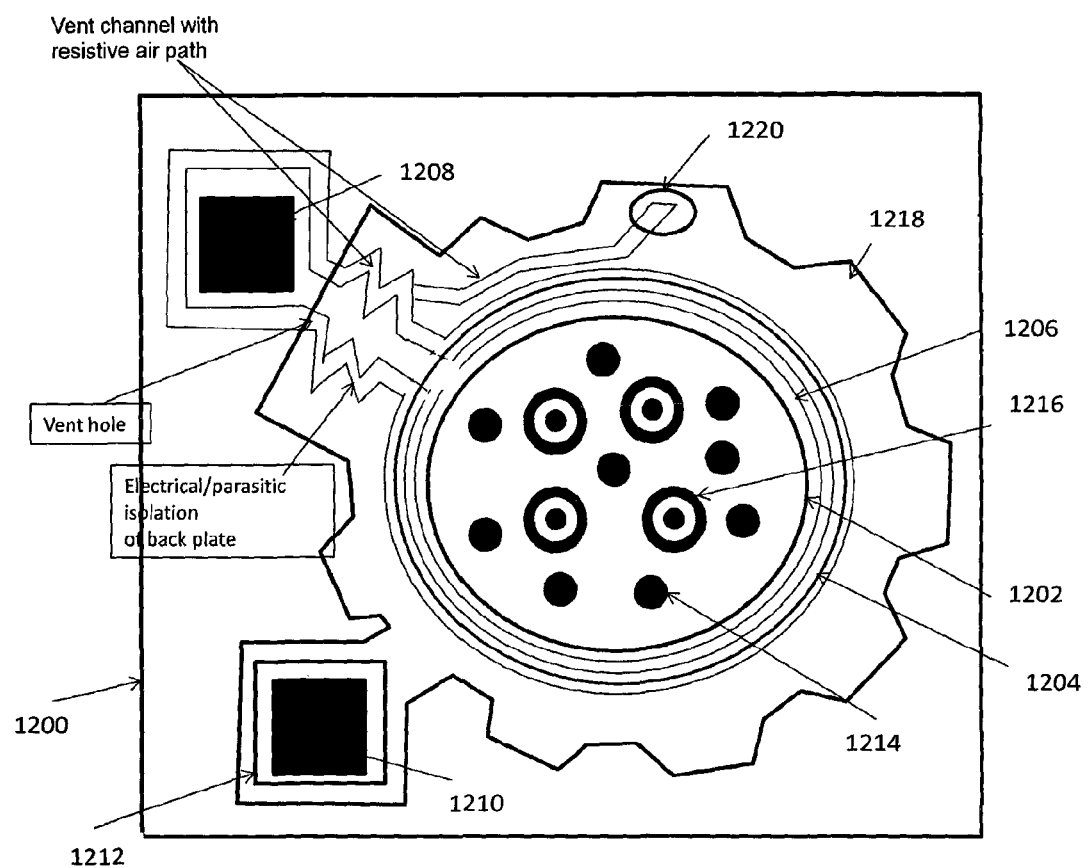
FIG. 12 illustrates top view of the capacitive sensor according to one embodiment of the present invention.

FIG. 12 illustrates top view the complete structure of a capacitive pressure sensor according to one embodiment of the present invention. The capacitive pressure sensor die 1200 includes a fixed back plate 1202, a movable diaphragm 1204, and a cavity 1206 in between. Electrical contacts 1208 and 1210 are provided respectively to the back plate and diaphragm. Further 1212 indicates contact opening. The capacitive pressure sensor 1200 also includes damping holes 1214, over pressure stopper studs 1216 and electrical/parasitic isolation of diaphragms 1218. Vent holes 1220 with resistive air path is also shown.

FIG. 13 *a-o* illustrates fabrication sequence of a pressure sensor according to one embodiment of the present invention. Typically layer 1 includes handle/constraint wafer. Layer 2 which is back plate in this case is formed on layer 1 through an adhesive layer 1 (shown in FIG. 13*a*). The adhesive layer 1 may be silicon dioxide layer. Next, a masking layer (shown in FIG. 13*b*) is formed on top of layer 2. For example, the adhesive layer may be silicon dioxide ($SiO_2$).

Figure 13A:
FIG. 13a-13o illustrates unique fabrication sequence of a capacitive pressure sensor according to the one embodiment of the present invention.
Figure 13B:
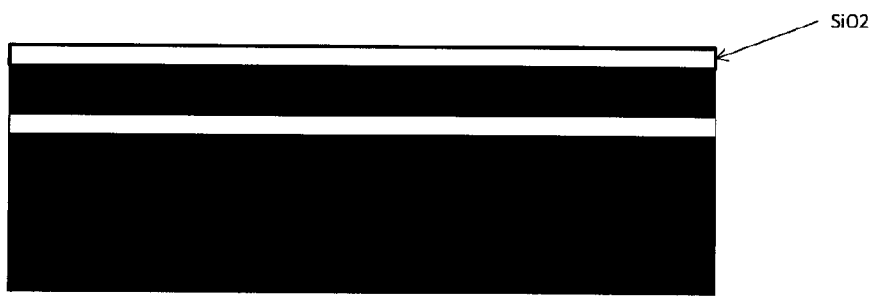
Figure 13C:
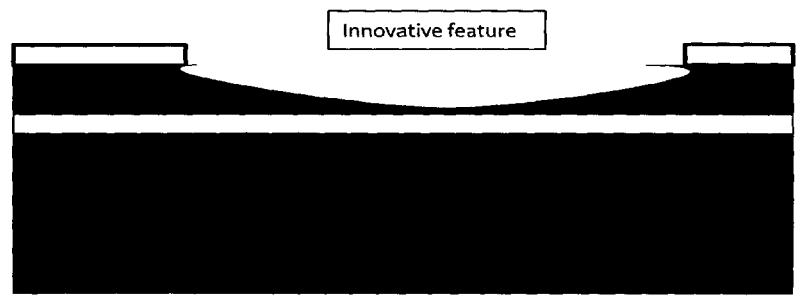
Figure 13D:
Figure 13E:
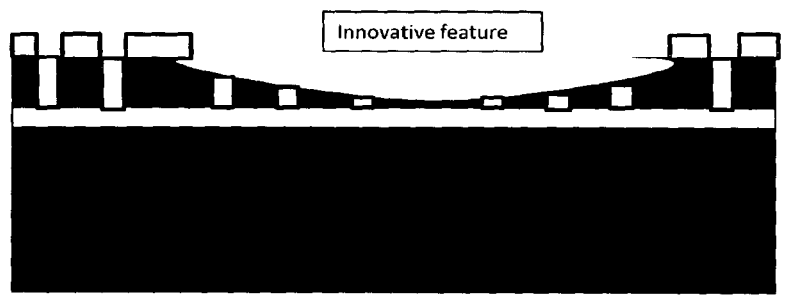

Thereafter a pattern is formed in the masking layer of silicon dioxide and layer 2 is removed or etched away to form a concave or step down cavity (shown in FIG. 13*c*). Then the masking layer is further patterned and etched for back plate, electrical isolation and vent channel (shown in FIG. 13*d*). Thereby unique back plate isolation for parasitic reduction, electrical isolation of back plate vent channel and damping holes are formed through layer 2 (shown in FIG. 13*e*).

Figure 13F:
Figure 13G:
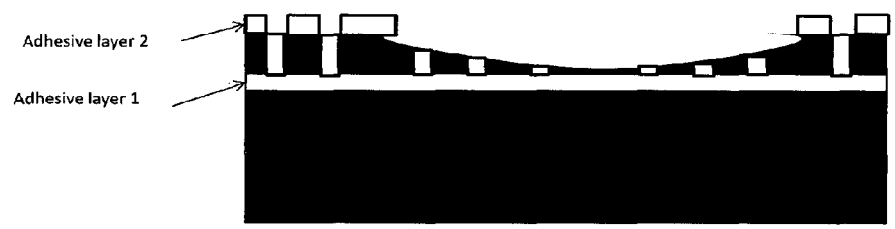
Figure 13H:
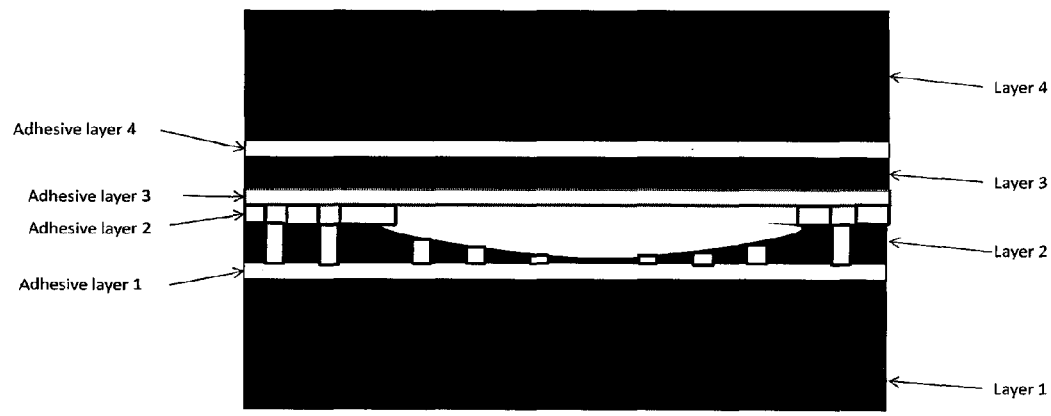

Layer 3 which is diaphragm in this case is formed on layer 4 through an adhesive layer 4 (shown in FIG. 13*f*). Layer 4 works as handle or constraint wafer in this case which can be silicon or insulator (SOI) wafer. The adhesive layer 4 may be silicon dioxide. Using the masking layer as adhesive layer 2, both sets are bonded together and in this case fusion bonding is used to bond the two sets together (shown in FIGS. 13*g* and 13*h*).

Figure 13I:
Figure 13J:
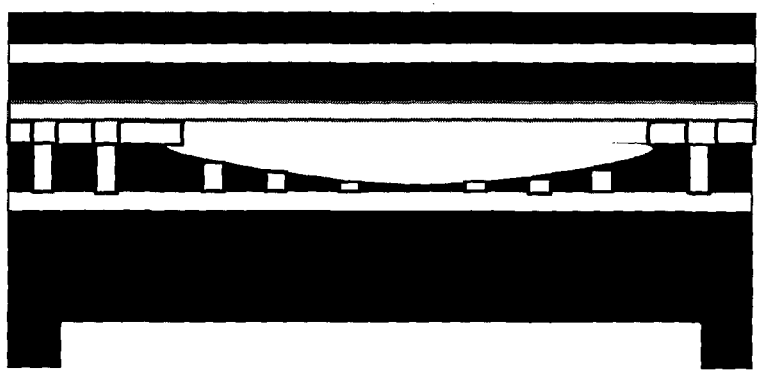
Figure 13K:
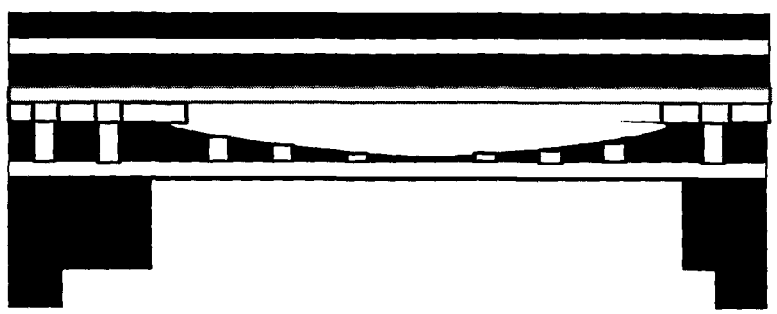

After fusion bonding of both sets layer 4 is grinded and reduced to tenth of microns (shown in FIG. 13*i*). Then back chamber volume is extended. First, an extended back chamber is formed in layer 1 and then full back chamber is formed in layer 1 (shown in FIGS. 13*j* and 13*k*).

Figure 13L:
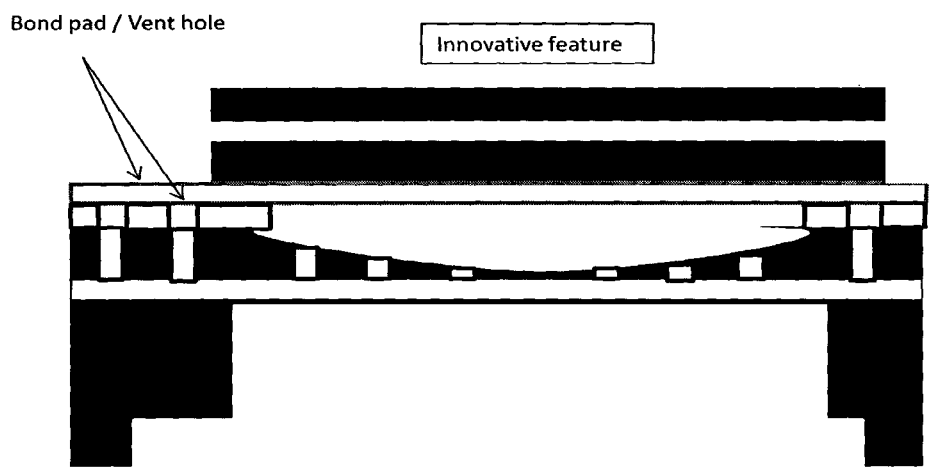
Figure 13M:
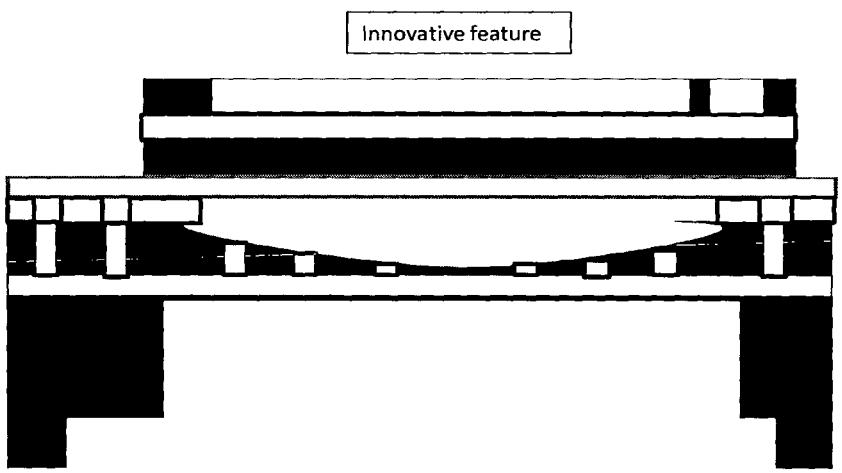

Thereafter, vent hole and bond pad opening is formed (shown in FIG. 13*l*). Further, diaphragm, electrical isolation, parasitic reduction and bond pad are formed (shown in FIG. 13*m*).

Figure 13N:
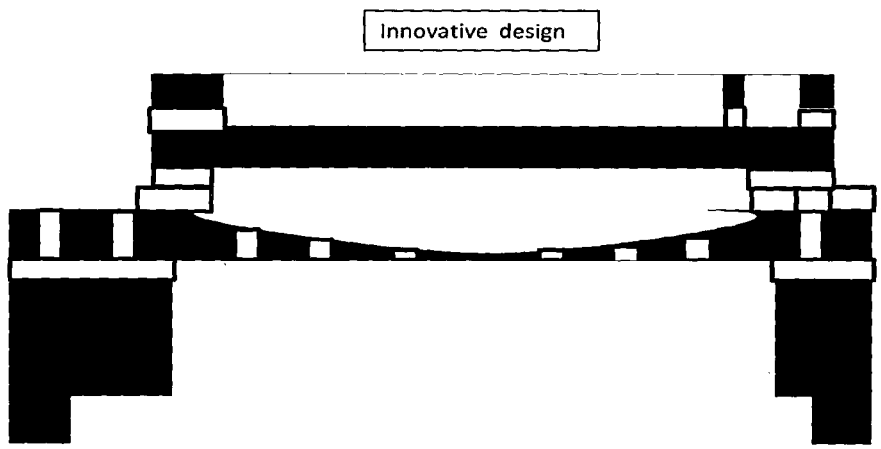
Figure 13O:
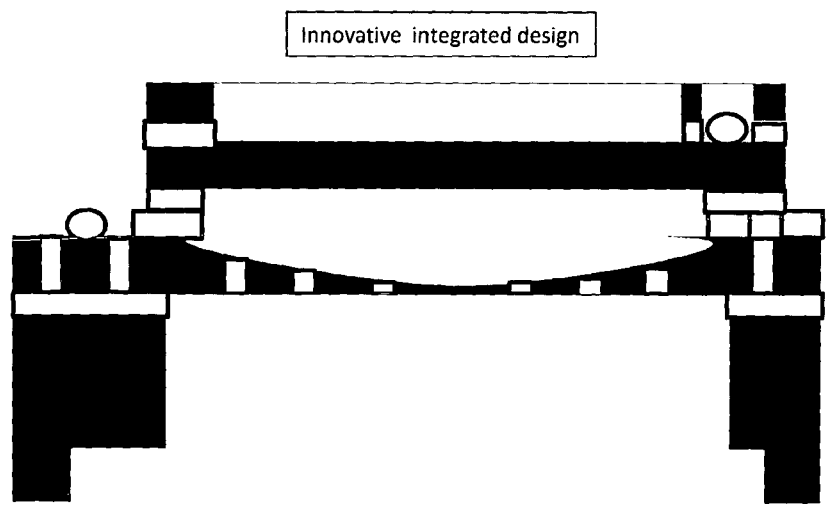
Figure 14:
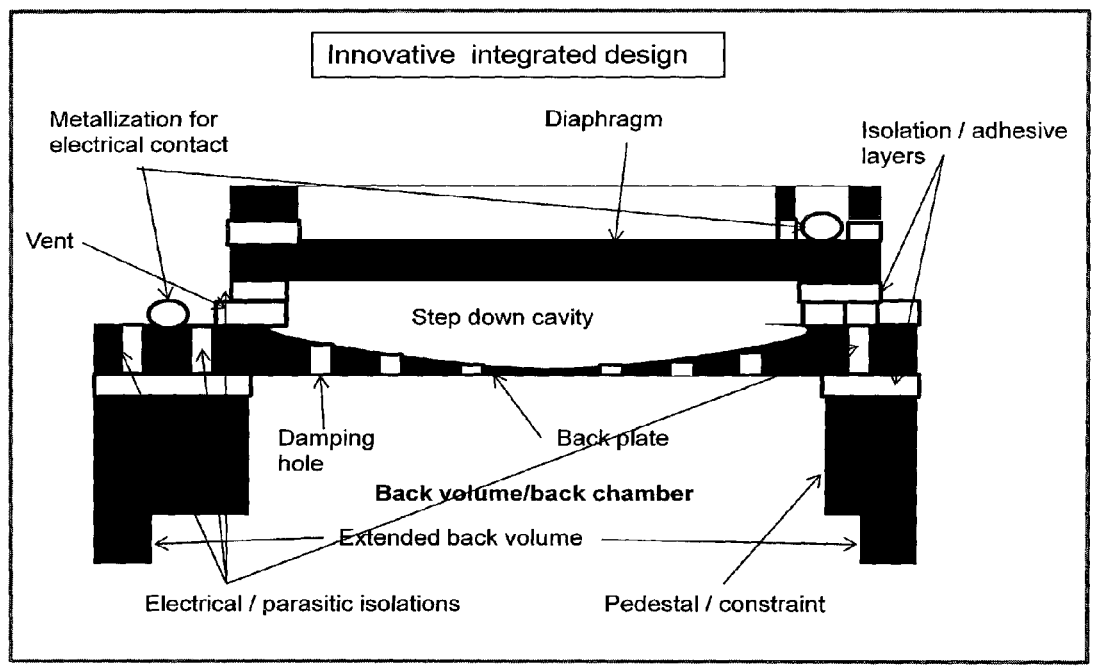
FIG. 14 illustrates complete design of the capacitive pressure sensor according to one embodiment of the present invention.

Next all the unnecessary adhesive layers are removed and plates are freed (shown in FIG. 13*n*). Thereafter, metal is sputtered through via holes on contact pads (shown in FIG. 13*o*). FIG. 14 shows the side view of the capacitive pressure sensor with the present design features.

Figure 15:
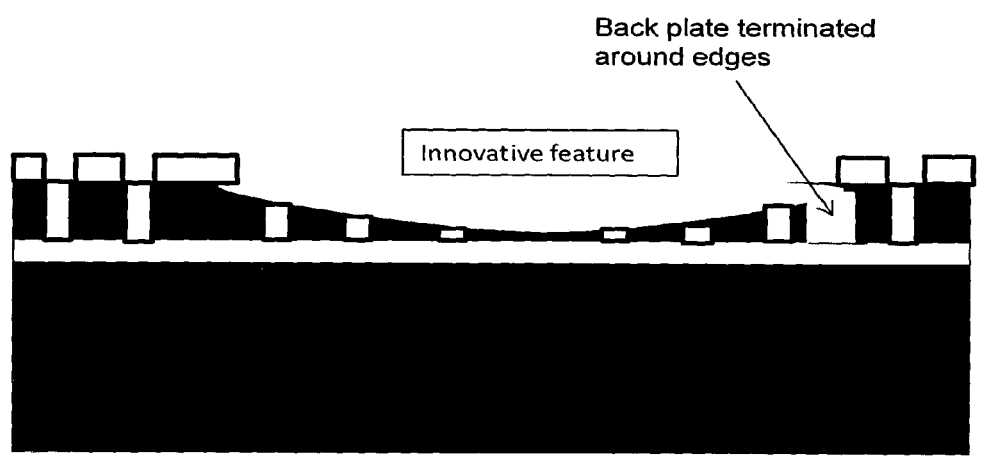
FIG. 15 illustrates design of a capacitive pressure sensor with anchoring back plate according to another embodiment of the present invention.

In another embodiment of the present invention, the capacitive pressure sensor may include optional anchoring back plate. During the formation of the damping holes, the mask is designed to etch around the edges of the plate except for the anchoring area as shown in FIG. 15. This enables the back plate to be floated once the isolation and adhesive layer is removed. The function is impeded in the same mask as where damping holes are formed, therefore it does not requires any extra steps. Furthermore, there are no additional changes to the process as mentioned above.

Figure 16A:
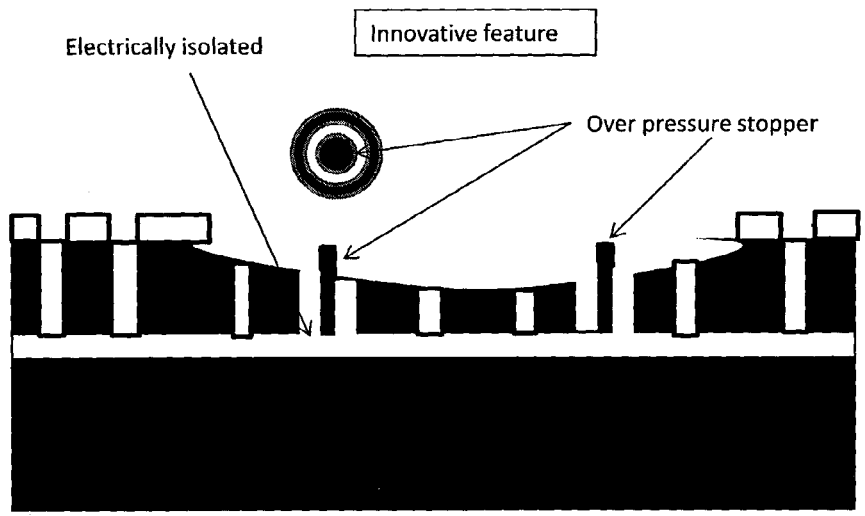
FIG. 16a-b illustrates design of a capacitive pressure sensor with pressure stopper according to another embodiment of the present invention.
Figure 16B:
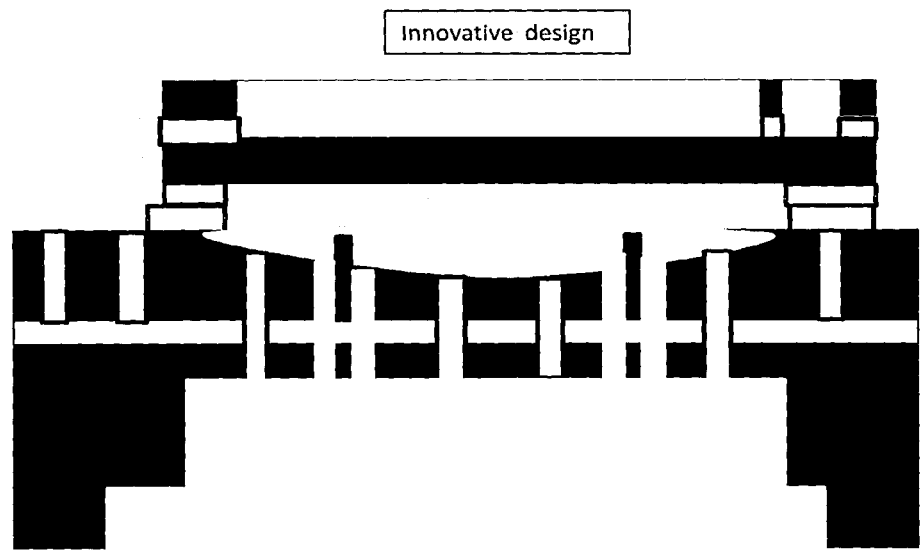

FIG. 16*a-b* illustrates design fabrication of a capacitive pressure sensor according to another embodiment of the present invention including optional over pressure stopper. FIG. 16*a-b* shows differences in fabrication sequence, showing the inclusion of an electrically isolated over-pressure stopper.

It is to be understood by a person of ordinary skill in the art that various modifications and variations may be made without departing from the scope and spirit of the present invention. Therefore, it is intended that the present invention covers such modifications and variations provided they come within the ambit of the appended claims and their equivalents.

We claim:

1. A capacitive pressure sensor comprising:
    a fixed plate defining a back plate for being anchored at the edges to keep the remaining area afloat for minimizing parasitic capacitance, the fixed plate including a contoured surface;
    a moveable plate configured as diaphragm for sensing pressure, wherein a cavity is formed between the fixed plate and the movable plate to allow deflection of the diaphragm, the moveable plate in electrical communication with the fixed plate by electrical contacts;
    an isolation layer between the fixed plate and the moveable plate and the electrical contacts, for minimizing the leakage current;
    a plurality of damping holes arranged on the fixed plate along the contoured surface of the fixed plate, such that the exertion of pressure on the diaphragm deflects the diaphragm to conform to the contoured surface of the fixed plate;
    a vent hole extending to the cavity having resistive air path for providing equilibrium to the diaphragm when exposed to the environmental pressure;
    a pedestal extending from the back plate; and,
    a cut-away area in the pedestal defining an extended back chamber with extended volume for increasing the sensitivity of the capacitive pressure sensor.

2. The capacitive pressure sensor as claimed in claim 1, comprising a plurality of pressure stopper studs disposed on the fixed plate for preventing the diaphragm from collapsing on the back plate.

3. The capacitive pressure sensor of claim 1, wherein the contoured surface is curved.

4. A method of fabricating a capacitive pressure sensor comprising the steps of:
   forming a first wafer substrate comprising:
      a first layer and second layer bonded by a first adhesive layer and a masking layer of silicon dioxide on top of the second layer;
   etching away the masking layer and the second layer to form a cavity of a concave shape;
   forming a pattern on the masking layer for a back plate, an electrical isolation layer and a vent channel, by etching;
   forming the back plate including a floating area for reduction of parasitic capacitance, including forming a contoured surface for the back plate;
   forming a plurality of damping holes through the second layer along the contoured surface of the back plate;
   forming a second wafer substrate comprising a third layer having a third adhesive layer thereunder, and a fourth layer bonded by a fourth adhesive layer wherein the fourth layer is configured as constraint wafer;
   coupling the first substrate wafer with the second substrate wafer by bonding the masking layer as second adhesive layer;
   reducing the third layer to form a layer of diaphragm;
   forming an extended back chamber in the first layer for enhanced sensitivity; and,
   forming an opening for vent hole in the masking layer for providing equilibrium to the diaphragm.

5. The method of fabricating a capacitive pressure sensor as claimed in claim 4, comprising removing unnecessary adhesive layers associated with the back plate and the diaphragm.

6. The method of fabricating a capacitive pressure sensor as claimed in claim 4, wherein the first wafer substrate is bonded with the second wafer substrate by fusion bonding.

7. The method of fabricating a capacitive pressure sensor as claimed in claim 4, wherein the formation of the extended back chamber in the first layer comprising: forming a first step of an extended back chamber; and
   forming a second step of full back chamber in the first layer.

8. The method of fabricating a capacitive pressure sensor as claimed in claim 4, comprising etching the masking layer around the edges except at an anchoring area for forming the back plate.

9. The method of fabricating a capacitive pressure sensor as claimed in claim 4, comprising: forming over pressure stopper studs through the second.

10. The method of fabricating a capacitive pressure sensor as claimed in claim 4, wherein the contoured surface is curved.

11. The method of fabricating a capacitive pressure sensor as claimed in claim 4, wherein the reducing includes grinding the third layer in a range of tenths of microns.

\* \* \* \* \*